US 6,737,110 B1

(12) United States Patent
Stolle et al.

(10) Patent No.: US 6,737,110 B1
(45) Date of Patent: May 18, 2004

(54) METHOD FOR PRODUCING A HEAT INSULATING LAYER

(75) Inventors: Ralf Stolle, Dachau (DE); Thomas Cosack, Windach (DE); Klaus Schweitzer, Niederpöcking (DE); Michael Pulver, Bad Nenndorf (DE); Georg Wahl, Wolfenbüttel (DE)

(73) Assignee: MTU Aero Engines GmbH, Munich (DE)

( * ) Notice: Subject to any disclaimer, the term of this patent is extended or adjusted under 35 U.S.C. 154(b) by 0 days.

(21) Appl. No.: 09/868,447

(22) PCT Filed: Dec. 17, 1999

(86) PCT No.: PCT/DE99/04018

§ 371 (c)(1),
(2), (4) Date: Nov. 30, 2001

(87) PCT Pub. No.: WO00/37711

PCT Pub. Date: Jun. 29, 2000

(30) Foreign Application Priority Data

Dec. 18, 1998 (DE) .......................................... 198 58 701

(51) Int. Cl.⁷ .............................................. C23C 16/40
(52) U.S. Cl. .............................. 427/255.28; 427/255.31
(58) Field of Search ........................ 427/255.28, 255.31

(56) References Cited

U.S. PATENT DOCUMENTS 5,902,638 A * 5/1999 Vakil ....................... 427/248.1
6,193,911 B1 * 2/2001 Hunt et al. ................ 252/518.1
6,207,522 B1 * 3/2001 Hunt et al. ................... 438/393

FOREIGN PATENT DOCUMENTS

EP    0 055 459     7/1982
WO    94/21841     9/1994

OTHER PUBLICATIONS

Kim, et al., "Deposition and Structural Characterization of ZR02 and YTTRIA–Stabilized ZR02 Films by Chemical Vapor Deposition", Thin Solid Films, CH, Elsevier–Sequoia S.A. Lausane, Bd. 254, Nr. 1/02, Jan. 1, 1995, pp. 33–38.

Cao, et al., "Research on YSZ Thin Films Prepared by Plasma–CVD Process" Thin Solid Films, CH, Elsevier–Sequoia S.A. Lausane, Bd. 249, No. 2, Sep. 15, 1994, pp. 163–167.

Masanobu, et al., Preparation of ZR02–Y203 Films by CVD Using B–Diketone Metal Chelates, Journal o f the Ceramic Society of Japan, International Edition, JP, Fuji Technology Press, Tokyo, Bd. 101, Nr. 3, Mar. 1, 1993, pp. 283–286.

Bertrand, et al., "Zirconia coatings realized by microwave plasma–enhanced chemical vapor deposition", Thin Solid Films, CH, Elsevier–Sequoia S.A. Lausane, Bd. 292, Nr. 1, Jan. 5, 1997, pp. 241–246.

* cited by examiner

*Primary Examiner*—Bret Chen
(74) *Attorney, Agent, or Firm*—Kenyon & Kenyon

(57) ABSTRACT

A process for producing a thermal barrier coating, in which organometal complexes of zirconium and at least one stabilizing element selected from the group of the alkaline earth metals or rare earths are provided as starting substances, the starting substances are evaporated by heating and the coating gases that are generated in this manner are transported to a component to be coated, which is heated at a deposition temperature, where they are broken down so that a layer is deposited, in which process, in order to produce a thermal barrier coating with a columnar structure and a sufficient layer thickness, the starting substances are heated, at a process pressure of 0.5 to 50 mbar, to at most 250° C. so that the coating gases are formed, and the coating gases are transported to the component to be coated, the surface of which is heated at a deposition temperature of between 300° C. and 1100° C.

12 Claims, 1 Drawing Sheet

METHOD FOR PRODUCING A HEAT INSULATING LAYER

FIELD OF THE INVENTION

The present invention relates to a process for producing a thermal barrier coating, in which organometal complexes of zirconium and at least one stabilizing element selected from the group of the alkaline earth metals or rare earths are provided as starting substances, the starting substances are evaporated by heating and the coating gases which are generated are transported to a component to be coated, which is heated at a deposition temperature, where they are broken down so that a layer is deposited.

BACKGROUND INFORMATION

Electron beam physical vapor deposition (EB-PVD) processes, in which the substances that are to be deposited on the metallic component, such as, for example, zirconium oxide, are vaporized in a high-vacuum environment using an electron beam, are conventionally used for the production of thermal barrier coatings. On account of the considerable introduction of energy, a thin, molten zone is formed, from which the substances are vaporized and, in a condensation reaction, are deposited on the surface of the component. The layers produced in this manner have a columnar structure which tolerates expansion, is better able to withstand alternating temperature stresses and results in a prolonged service life.

Drawbacks of these processes are the extremely high installation costs for the electron beam gun, for the generation of the high vacuum, for the vacuum chamber and for the partial pressure control. Furthermore, those surfaces of the component that are not directly visible cannot be coated or can only be insufficiently coated during the coating cycle.

European Published Patent Application No. 0 055 459 describes a process for producing oxide layers by chemical vapor deposition (CVD), in which complexes derived from diketones, such as, for example, acetylacetonate complexes, are mixed with steam in order to oxidize the metals contained in the complexes and are deposited on a substrate. In the process, the substrate is heated in various applications to temperatures of between 350° C. and 800° C. The thicknesses of the deposited layers are in the range between 3.6 and 34 μm. The use of steam as a carrier gas has proven imperative, since oxygen does not enable either reproducibility or deposition to be achieved.

International Published Patent Application No. WO 94/21841 describes a flame CVD process for applying inorganic layers to substrates, in which mixed oxides, such as yttrium-stabilized zirconia, are deposited at flame temperatures of between 300° C. and 2800° C. and pressures that are well above ambient pressure. The starting substances for the coating gases are passed into the flame and, in a flame CVD process of this type, cannot be heated with a defined temperature cycle and transported to the substrate.

In conventional processes for producing thermal barrier coatings by means of chemical vapor deposition (CVD), it has only been possible to produce very thin layers with a low deposition rate and without a columnar structure, which layers also present poor adhesion and, moreover, contain relatively large quantities of undesirable carbon impurities. Relative to industrial use, the selection of the starting substances is of particular importance, since they must not be too expensive and they must be available in sufficient quantities.

It is an object of the present invention to provide a process for producing a thermal barrier coating in which a thermal barrier coating with sufficient layer properties and a columnar structure is produced as inexpensively as possible.

SUMMARY

According to one example embodiment of the present invention, the starting substances are heated, at a process pressure of 0.5 to 50 mbar, to at most 250° C. so that the coating gases are formed, and the coating gases are transported to the component to be coated, the surface of which is heated at a deposition temperature of between 300° C. and 1100° C.

Thermal barrier coatings that contain zirconium oxide and, for example, yttrium oxide, may be produced with a sufficiently large layer thickness of approximately 25 to 1000 μm using the process that is based on the chemical vapor deposition (CVD) principle. Moreover, the thermal barrier coatings produced in this manner have a suitable crystal structure and morphology and required layer properties. In terms of their ability to withstand alternating temperature stresses, the layers are comparable to those produced using the EB-PVD process. A further advantage is that, unlike in the electron beam physical vapor deposition (EB-PVD) process, the scattering force of the process means that even those surfaces of the component to be coated that are not directly visible may be coated.

Organometal complexes, which are derived from diketones, of zirconium and at least one stabilizing element selected from the group consisting of the alkaline earth metals or rare earths are provided as starting substances, since with these components the coating gases are completely broken down or burnt when they come into contact with that surface of the component that has been heated to deposition temperature. Moreover, they have the advantage over alkoxides that they are not sensitive to hydrolysis and are therefore easier to handle.

Furthermore, the coating gases may be mixed with a carrier gas, such as, for example, oxygen or a mixture of oxygen and argon.

In a further example embodiment of the process according to the present invention, the coating gases or the coating gases and the carrier gas may be transported to the component to be coated, which is arranged in a receptacle, in an admission system that has been heated to at most 250° C.

The process may be performed at a low process pressure of 0.5 to 50 mbar, in order that the coating gases or the coating gases and the carrier gas are transported as quickly as possible, so that their residence time in the hot zone produced by the thermal radiation of the component or substrate that has been heated to the deposition temperature is as short as possible and to minimize vapor phase reactions.

Yttrium, lanthanum, calcium, magnesium or cerium may be provided as the stabilizing element from the group consisting of the alkaline earth metals or rare earths, since they are not excessively expensive with regard to process costs and, furthermore, are available in sufficient quantities for industrial use.

DETAILED DESCRIPTION

Figure 1:
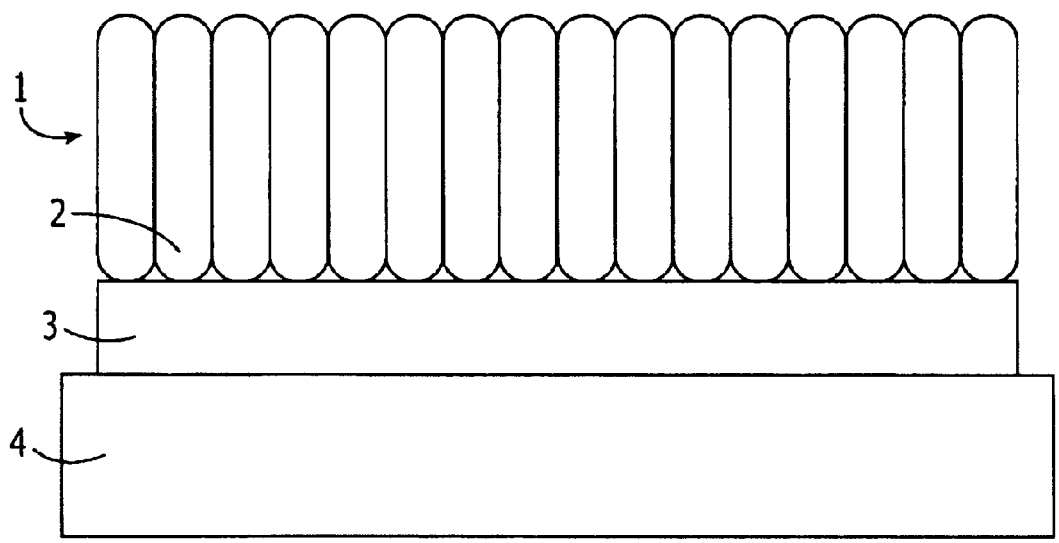
FIG. 1 is a schematic cross-sectional view through a thermal barrier coating that has been produced using one example embodiment of the process according to the present invention.
Figure 2:
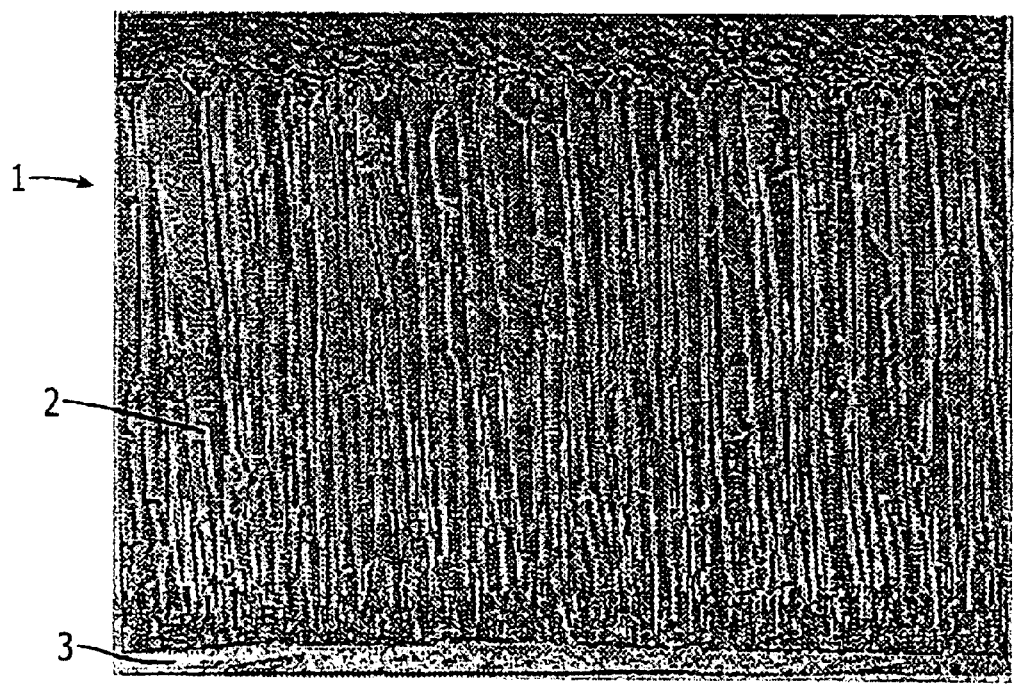
FIG. 2 is a microscopic image of a thermal barrier coating that has been produced using an example embodiment of the process according to the present invention, in which image a columnar structure may be recognized.

FIG. 1 illustrates a thermal barrier coating 1, which has a columnar structure 2, i.e., a fringe crystal structure, which has been deposited on a substrate 4 provided with an adhesion layer 3. In the present example embodiment, the substrate 4 is a surface of a metallic rotor blade of a gas turbine around which hot gases flow in operation. Alternatively, the process may also be used, for example, to coat guide vanes of gas turbines or other parts of internal-combustion engines which are exposed to hot gases.

In the present example embodiment of the process for producing a thermal barrier coating by chemical vapor deposition (CVD), an adhesion layer 3 is applied to the surface of the rotor blade 4 around which hot gases flow using a conventional process. The adhesion layer 3 may be able to resist corrosion from hot gases and may, for example, be an aluminum diffusion layer, a platinum/aluminum diffusion layer or an MCrAlY cladding layer.

Then, the starting substances for the deposition of the thermal barrier coating 1 by chemical vapor deposition (CVD) are provided.

Acetylacetonate complexes of zirconium and yttrium that are in powder form and are mixed in the appropriate ratio to form the desired layer stoichiometry are selected for these materials. Alternatively, the starting substances may also be vaporized separately and mixed in the vapor phase. The starting substances are vaporized or converted into the vapor phase by being heated to at most 250° C., so that the coating gases are formed, and are transported to the rotor blades 4 to be coated. They are transported by suitable carrier gases, such as, for example, oxygen or a mixture of oxygen and argon.

Moreover, those surfaces of the rotor blades 4 that are to be coated are heated, by a suitable heat source, at a deposition temperature of between 300° C. and 1100° C. This ensures that the coating gases are not heated to over 250° C. on their flow path to the rotor blades 4 to be coated. This is effected by, for example, using an admission system that has been heated to at most 250° C. and is arranged so as to take account of the heat sources for the components or rotor blades 4, through which system the coating gases and the carrier gas are transported to that surface of the rotor blade 4 that is to be coated.

In the vicinity of those surfaces of the rotor blades 9 that have been heated to the deposition temperature, it may be impossible to completely prevent the coating gases from being heated to this extent due to thermal radiation. In order to suppress the vapor phase reactions of the coating gases that are possible at elevated temperatures, the thermal barrier coating 1 is produced or deposited at relatively low process pressures of 0.5 to 50 mbar, so that they have a short residence time in the hot zones around the rotor blades 4 that have been heated to deposition temperature. To achieve the low process pressure required for the present vapor phase deposition, the process is performed in a closed receptacle, to which a pump is connected.

When the coating gases come into contact with those surfaces of the rotor blades 4 that have been heated to deposition temperature, the chemical decomposition of the starting substances occurs and yttria-stabilized zirconia is deposited so as to form the thermal barrier coating 1 and gaseous by-products. Complete decomposition occurs due to the high deposition temperatures. There are substantially no carbon impurities. Furthermore, the thermal barrier coating 1 that has been deposited has a columnar structure 2 or fringe crystal structure that is able to tolerate expansion and is of benefit to the resistance to alternating temperature stresses and to the service life of the thermal barrier coating 1. In the process according to the present invention, the scatter that is achieved by use of the aerodynamic flow conditions results in not only those surfaces of the rotor blades 4 that are directly visible or exposed to flow, but also all of the other surfaces that are exposed to the flow of the coating gases and have been heated, are coated. The by-products are broken down in a downstream pyrolysis furnace and are then filtered and disposed of.

To improve the uniformity of coating, the rotor blades 4 may be moved inside the receptacle. Depending on how the process is controlled, it is possible to deposit thermal barrier coatings 1 with a layer thickness of approximately 25 to 1000 $\mu$m on the surfaces of the rotor blades 4, the layer thickness generally being between 75 and 250 $\mu$m. Compared to rotor blades, the thermal barrier coatings 1 deposited on guide vanes of gas turbines often have higher layer thicknesses. To form the thermal barrier coatings 1, deposition in the present uses zirconia partially stabilized with 7–9% by weight of yttria. The process may be used for all parts of a gas turbine or other internal-combustion engines that are exposed to hot gases.

What is claimed is:

1. A method for producing a thermal barrier coating for a component of an internal-combustion engine, the component being exposed to hot gases, the thermal barrier coating having a columnar structure, comprising the steps of:

providing acetylacetonates of zirconium and at least one stabilizing element selected from the group consisting of alkaline earth metals and rare earths as starting substances;

vaporizing the starting substances by heating to at most 250° C. so as to form coating gases;

transporting the coating gases in an admission system that has been heated to at most 250° C. to the component; and depositing the thermal barrier coating having a layer thickness between 25 $\mu$m and 1000 $\mu$m by heating a surface of the component to be coated at a deposition temperature between 300° C. and 1100° C. at a process pressure of between 0.5 mbar and 50 mbar so that the coating gases are broken down.

2. The method according to claim 1, wherein the surface of the component to be coated is heated in the depositing step at a deposition temperature of between 800° C. and 1100° C.

3. The method according to claim 1, wherein the stabilizing element includes one of yttrium, lanthanum, calcium, magnesium and cerium.

4. The method according to claim 1, further comprising the step of mixing the coating gases with a carrier gas.

5. The method according to claim 4, wherein the carrier gas includes one of oxygen and a mixture of oxygen and argon.

6. The method according to claim 4, wherein the coating gases and the carrier gas are transported to the component to be coated in the admission system.

7. The method according to claim 1, wherein the starting substances are provided in the providing step in powder form.

8. The method according to claim 1, wherein zirconia partially stabilized with 7% to 9% by weight of yttria is deposited in the depositing step.

9. The method according to claim 1, wherein the thermal barrier coating is deposited in the depositing step on the component in a layer thickness of between 75 μm and 250 μm.

10. A method for producing a thermal barrier coating for a component of an internal-combustion engine, the component being exposed to hot gases, the thermal barrier coating having a columnar structure, comprising the steps of:

providing a starting substance including acetylacetonates of zirconium and at least one stabilizing element;

vaporizing the starting substances by heating to at most 250° C. so as to form coating gases;

transporting the coating gases to the component in an admission system that has been heated to at most 250° C.; and depositing the thermal barrier coating having a layer thickness between 25 μm and 1000 μm by heating a surface of the component to be coated at a deposition temperature between 300° C. and 1100° C. at a process pressure of between 0.5 mbar and 50 mbar so that the coating gases are broken down, wherein the at least one stabilizing element is selected from the group consisting of beryllium, magnesium, calcium, strontium, barium, radium, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium californium, einsteinium, fermium, mendelevium, nobelium, and lawrencium.

11. A method for producing a thermal barrier coating for a component of an internal-combustion engine, the thermal barrier coating having a columnar structure, comprising the steps of:

providing acetylacetonates of zirconium and at least one stabilizing element selected from the group consisting of alkaline earth metals and rare earths as starting substances;

vaporizing the starting substances by heating to at most 250° C. so as to form coating gases;

heating a component to be coated to a deposition temperature between 300° C. and 1100° C.; and exposing the heated component to be coated to the vaporized starting substances at a process pressure of between 0.5 mbar and 50 mbar so as to form a thermal barrier coating on said component, the starting substances at least one of breaking down and burning upon contact with the heated component.

12. The method as claimed in claim 11, wherein the coating formed is between 25 μm and 1000 μm thick.

* * * * *